United States Patent
Coffey

(10) Patent No.: US 9,934,639 B2
(45) Date of Patent: Apr. 3, 2018

(54) METHOD FOR MAGNETIC DETECTION OF ANOMALIES IN PRECIOUS METALS

(71) Applicant: Esker Coffey, Nikiski, AK (US)

(72) Inventor: Esker Coffey, Nikiski, AK (US)

( * ) Notice: Subject to any disclaimer, the term of this patent is extended or adjusted under 35 U.S.C. 154(b) by 106 days.

(21) Appl. No.: 15/000,377

(22) Filed: Jan. 19, 2016

(65) Prior Publication Data

US 2016/0209364 A1     Jul. 21, 2016

Related U.S. Application Data

(60) Provisional application No. 62/105,345, filed on Jan. 20, 2015.

(51) Int. Cl.
| | |
|---|---|
| *G01N 27/72* | (2006.01) |
| *G07D 5/08* | (2006.01) |
| *H01L 21/00* | (2006.01) |
| *H01F 1/00* | (2006.01) |

(52) U.S. Cl.
CPC ............. *G07D 5/08* (2013.01); *H01F 1/00* (2013.01); *H01L 21/00* (2013.01); *H01L 2221/00* (2013.01)

(58) Field of Classification Search
CPC ....... H01F 1/00; H01L 21/00; H01L 2221/00; G01D 1/00
See application file for complete search history.

(56) References Cited

U.S. PATENT DOCUMENTS

| | | | | |
|---|---|---|---|---|
| 5,565,772 | A | | 10/1996 | Jeffers |
| 5,756,220 | A | | 5/1998 | Hoshino et al. |
| 5,972,493 | A | * | 10/1999 | Iwasaki .................. B43L 1/008 428/323 |
| 5,975,581 | A | | 11/1999 | Nicolette et al. |
| 6,419,498 | B1 | * | 7/2002 | Ikeda ...................... G02F 1/172 252/62.51 R |
| 8,246,356 | B2 | * | 8/2012 | Vanderelli .............. G01R 33/10 434/276 |
| 8,523,236 | B2 | | 9/2013 | Leary |
| 2006/0152804 | A1 | * | 7/2006 | Bove ....................... G01R 33/10 359/487.06 |
| 2007/0269682 | A1 | * | 11/2007 | Matas ....................... G09F 7/04 428/692.1 |
| 2008/0289526 | A1 | * | 11/2008 | Bachman ................. C09D 5/38 101/450.1 |

\* cited by examiner

*Primary Examiner* — Jermele M Hollington
*Assistant Examiner* — Temilade Rhodes-Vivour
(74) *Attorney, Agent, or Firm* — Vincent G. LoTempio; Kloss, Stenger & LoTempio; David T. Stephenson

(57) ABSTRACT

A method and apparatus for using a magnetic element to detect the presence of foreign materials, or anomalies, embedded in an object including placing magnetic field viewing film over an object such as a coin and passing the magnetic element over the object in prescribed patterns. The object to be tested for an anomaly may be covered or encased in magnetic paper. The presence of a foreign material in the object will be detected by the film when a magnetic element passes by the anomaly. An anomaly, such as of tungsten hidden in a gold coin or nugget, is detected by the film due to the disruption of the magnetic field of the anomaly. The film will present a dark spot adjacent to the location of the hidden anomaly.

16 Claims, 6 Drawing Sheets

METHOD FOR MAGNETIC DETECTION OF ANOMALIES IN PRECIOUS METALS

This application claims the benefit of U.S. Provisional Application No. 62/105,345, filed on Jan. 20, 2015. The present disclosure relates generally to detecting anomalies within metal objects to establish purity or determine authenticity.

FIELD

Background

When determining the value of a precious metal, establishing uniform composition or purity is critical. Various tests have been developed to determine whether a precious metal, such as gold, does not contain anomalies of foreign material that would lower its value. Measuring the size, weight, conductivity or magnetic properties of an object of concern are known methods used to determine whether the object is free of impurities and anomalies.

The presence of an anomaly in a precious metal may be detected by measuring the weight of a test object and comparing it to its size. If the precious metal is of a standard size, the determination of weight may be dispositive in establishing purity. Due to the density of precious metals such as gold and silver, the presence of a foreign material embedded can cause the weight to be measurably lower than expected once size has been established. Therefore, precious metals containing an impurity that weigh correctly may be too large in diameter or thickness. Comparing the diameter and thickness of the coin in question with others known to be genuine can potentially indicate purity.

A standardized method of determining purity using size and weight is the Fisch test. Fisch testers are used to measure the size and weight of a standardized coin. Genuine coins will be both small enough in diameter and thin enough to fit through a slot in the Fisch test tool, while remaining heavy enough to tip the tool on its fulcrum.

Another method of detecting an anomaly in a precious metal involves measuring electrical conductivity. Using this method, it is necessary to measure the electrical resistance and the geometric dimensions of the object and to compare the resulting data to known standards.

A further method of measuring for purity involves the use of magnets. Magnets are known to be used in determining whether a gold or silver object is pure. Gold and silver are generally not magnetic. Therefore, if a strong magnet is placed against an object such as a gold coin containing a magnetic anomaly, the coin may stick to the magnet. However, due to variations in the size, depth, or composition of the anomaly, a gold or silver object containing an anomaly may not stick to the magnet.

An example of a common anomaly found in gold bars and coins is tungsten. Tungsten is commonly used in making counterfeit gold materials because it has a similar molecular weight and is therefore hard to detect by standard procedures such as measuring size and weight. Tungsten, however, has different magnetic properties than gold. There is a large difference between the magnetic susceptibilities of tungsten (8.44) and gold (3.44). Therefore, techniques using magnets to establish the presence of a tungsten anomaly in a gold object have been developed. These techniques, however, have limitations because the tungsten anomaly may not produce significant enough attraction for the object to stick to a magnet, yet may still significantly reduce the value of the object.

Gold and tungsten have very similar densities. Gold is 19.3 grams/cc and tungsten is 19.25 grams/cc. Counterfeiters exploit tungsten's high density to mimic gold and fool unsuspecting investors. Gold coins are being manufactured in China and these can be purchased on the internet, often for less than $300.00. The spot price for an ounce of gold, as of October 2015, was about $1,200. Unscrupulous gold sellers could, therefore, quadruple their investment using this strategy.

Accordingly, there is a need for a method or apparatus to detect anomalies hidden in an object by using a magnetic technique more sensitive than those currently known.

SUMMARY

The method of the present disclosure detects anomalies, such as tungsten, inside gold coin, bars, nuggets or bullion with magnetic field viewing film and a magnetic element. The present disclosure provides for a method including: encasing or covering an object potentially containing an anomaly or impurity with a magnetic field viewing film and a cover for holding the viewing paper in place; passing a magnetic element over the object to be tested, where all elements of the test kit, aside from the magnetic element, are herein referred to as the scanner, and determining a location of at least one anomaly based on a visualization by the magnetic field viewing film of a magnetic field disturbance produced by the at least one magnetic element. The magnetic element may preferably be comprised of a rare earth metal such as neodymium.

The present disclosure relates to systems, kits, apparatuses and methods for detecting hidden metal anomalies in embedded in a metal object. More particularly, the present disclosure relates to systems, kits, apparatuses and methods for detecting hidden metal anomalies in embedded in a metal object using magnetic field viewing film.

According to one aspect of the present disclosure, the anomaly may include, without limitation, tungsten, iron, copper, brass, glass, and metal alloys. Any materials that have a dissimilar magnetic susceptibility may be detectable by the method of the present disclosure.

DETAILED DESCRIPTION

Particular embodiments of the present disclosure are described hereinbelow with reference to the accompanying drawings. In the following description, well-known functions or constructions are not described in detail to avoid obscuring the present disclosure in unnecessary detail.

The present disclosure provides for a system and method for visualization of location of anomalies within a metal test object. The system includes a magnetic field viewing film disposed on an exterior portion of the metal test object. The film is configured to change visually (e.g., darken) when brought in proximity of a magnetic field. An anomaly within a test metal object will create a disturbance in the magnetic field, relative to what a metal test object without an anomaly would create. Anomalies that are to be visualized are magnetized such that the magnetic field is visualized by the film. Changes in the color density of the film allow the user to locate the anomaly.

Figure 1:
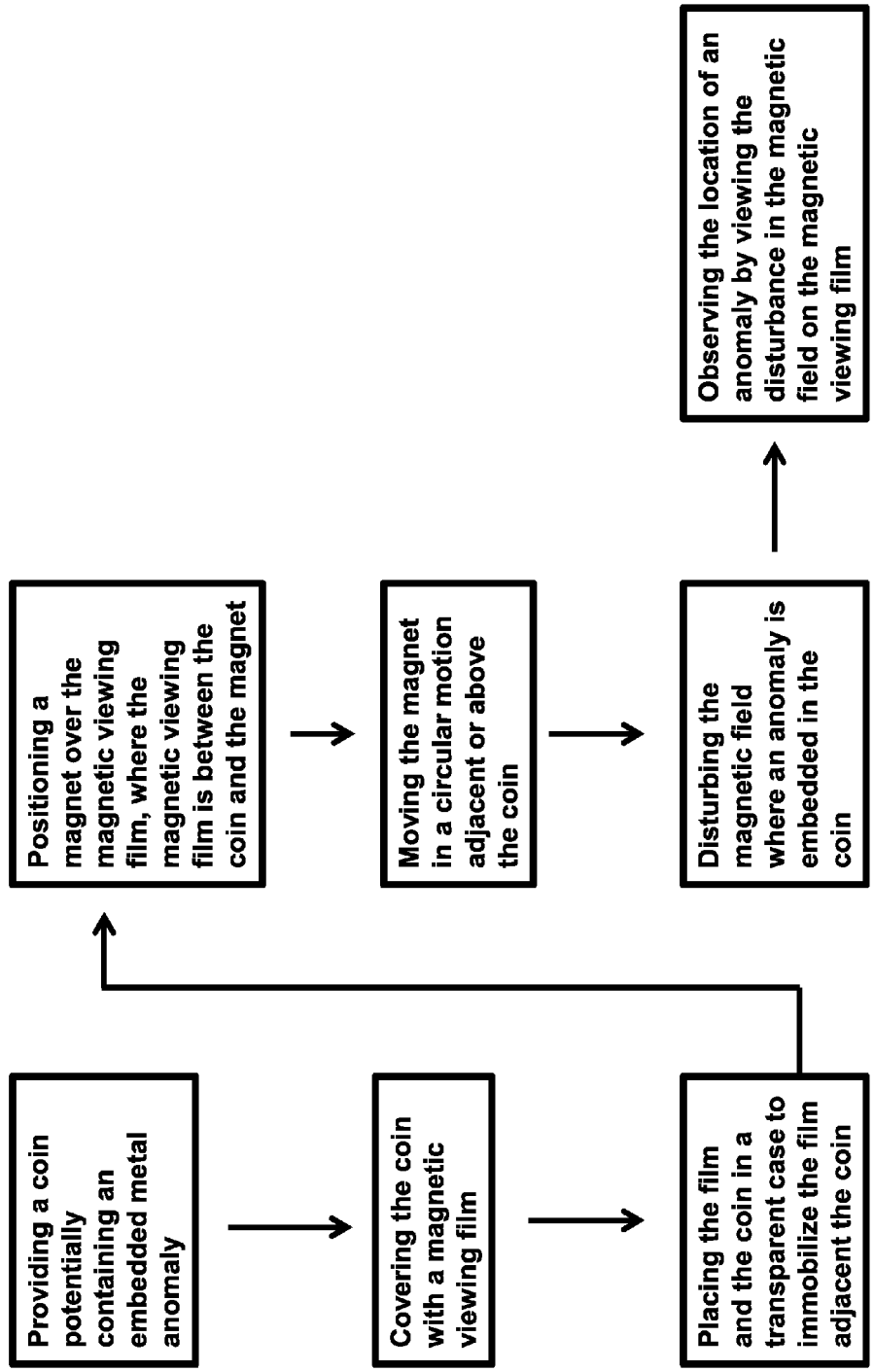
FIG. 1 is a flow chart showing the steps in an embodiment of the method of the present disclosure for use with a coin potentially containing an anomaly.

FIG. 1 is a flow chart disclosing the steps in an embodiment of the method of the present disclosure. FIG. 1 generally describes the method of the present disclosure to detect an anomaly within a coin. The method is highly effective in detecting tungsten or iron, common materials hidden in gold, silver, copper or lead, and used to deceive potential buyers into believing a coin to be pure. The method of the present disclosure, however, is not limited to use with these materials.

Figure 2:
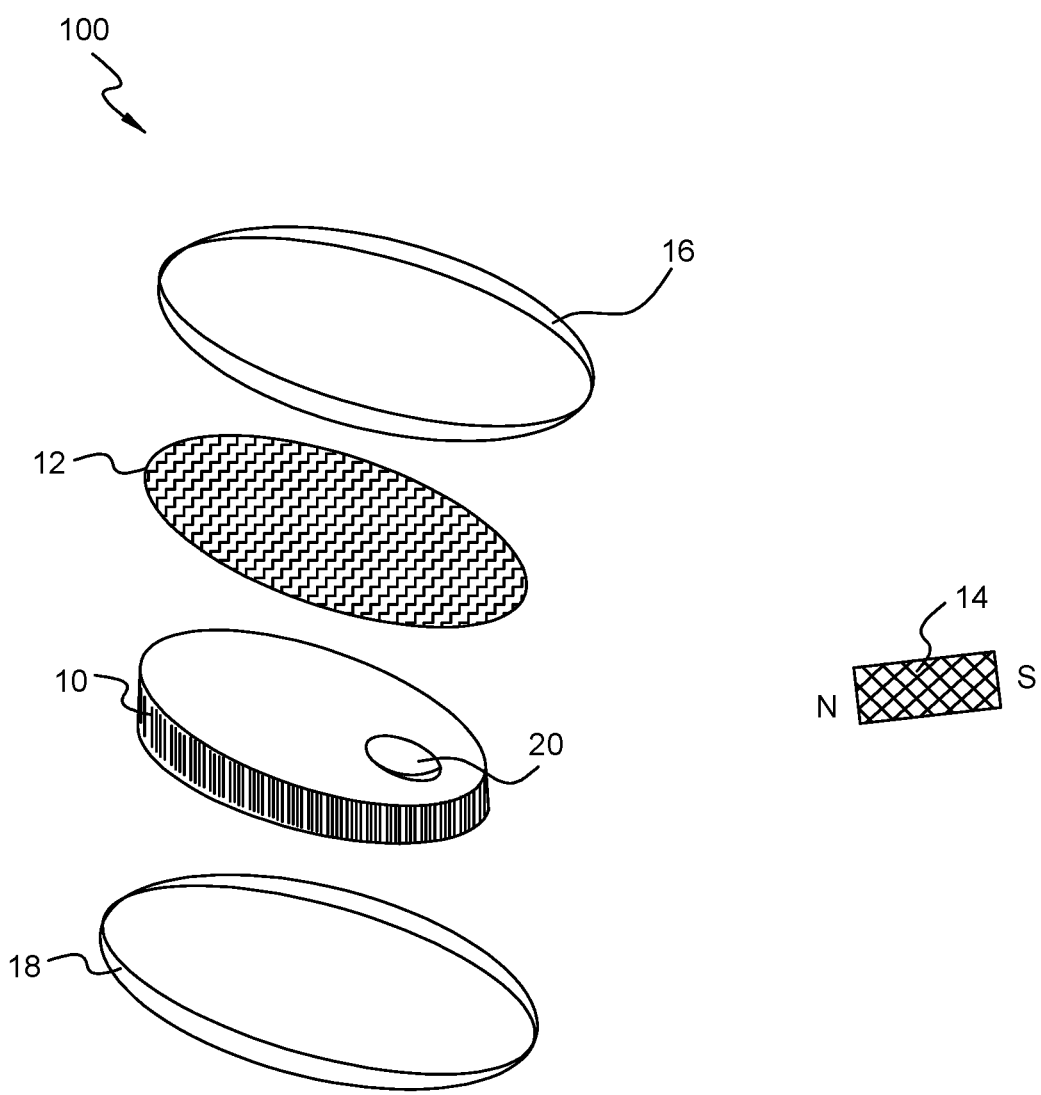
FIG. 2 is an exploded view of the coin scanner and the magnetic element, showing the magnetic field viewing film and an anomaly according to the present disclosure.

With reference to FIG. 2, an exploded view of an embodiment of the coin scanner 100 shows a coin 10 containing an anomaly 20 adjacent a magnetic field viewing film 12. Anomaly 20 may be hidden and embedded by the material comprising coin 10. Coin 10 is covered by a magnetic field viewing film 12. The film 12 includes a top sheet and a bottom sheet, which may be formed from any non-magnetic, flexible, transparent or translucent material that allows for transmission of magnetic fields and light. The magnetic field viewing film 12 is commercially available under the trade name Magne-View from Magne-Rite, Inc. The film 12 contains a flexible sheet, coated with micro-capsules containing nickel flakes suspended in oil. Film 12 is held in place adjacent to coin 10 in an acrylic housing having an upper portion 16 and a lower portion 18. Upper portion 16 and lower portion 18 of the housing may be pressed together to form the housing, wherein the housing has a hollow chamber capable of containing coin 10. In certain embodiments a shim may be inserted between upper portion 16 and lower portion 18. Application of magnet 14 to coin scanner 100 in accordance with the method of the present disclosure produces magnetic susceptibility imaging (MSI) of anomalies, or foreign materials, in precious metals.

Figure 3A:
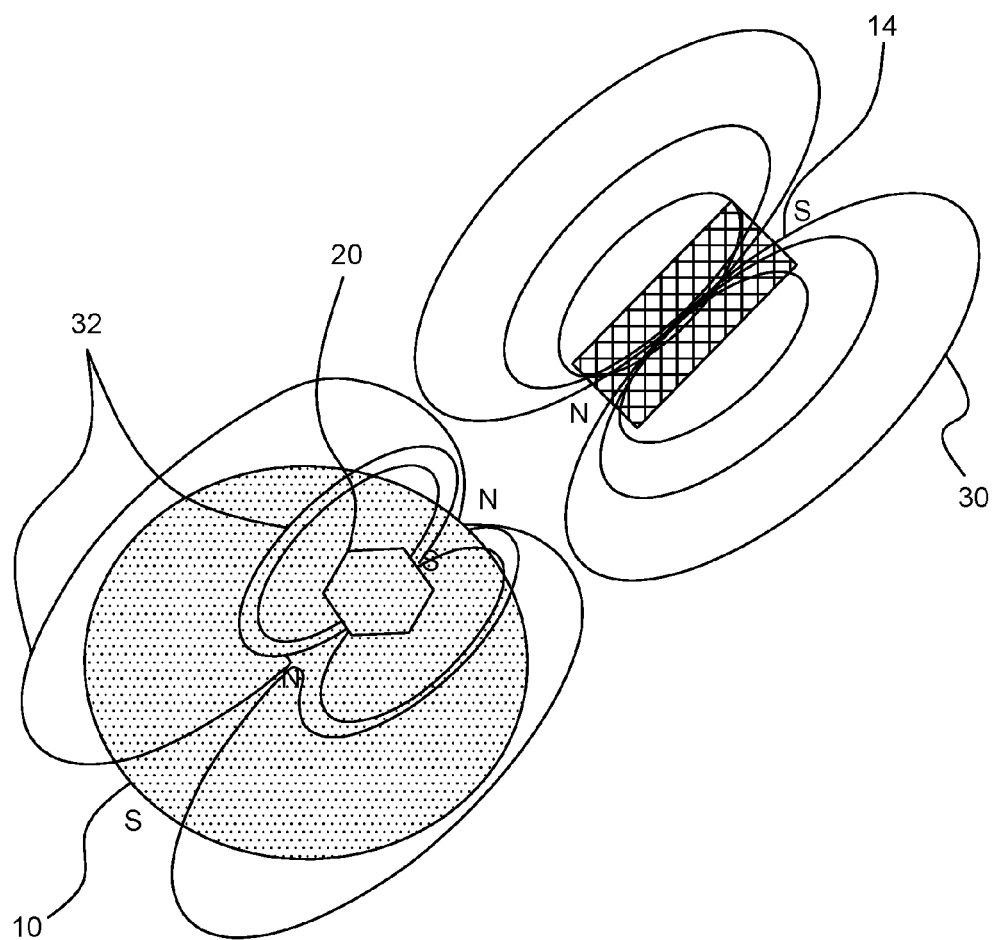
FIG. 3A is a top view of the coin having an anomaly, the magnetic element and the magnetic fields of the anomaly and the magnetic element according to the present disclosure.
Figure 3B:
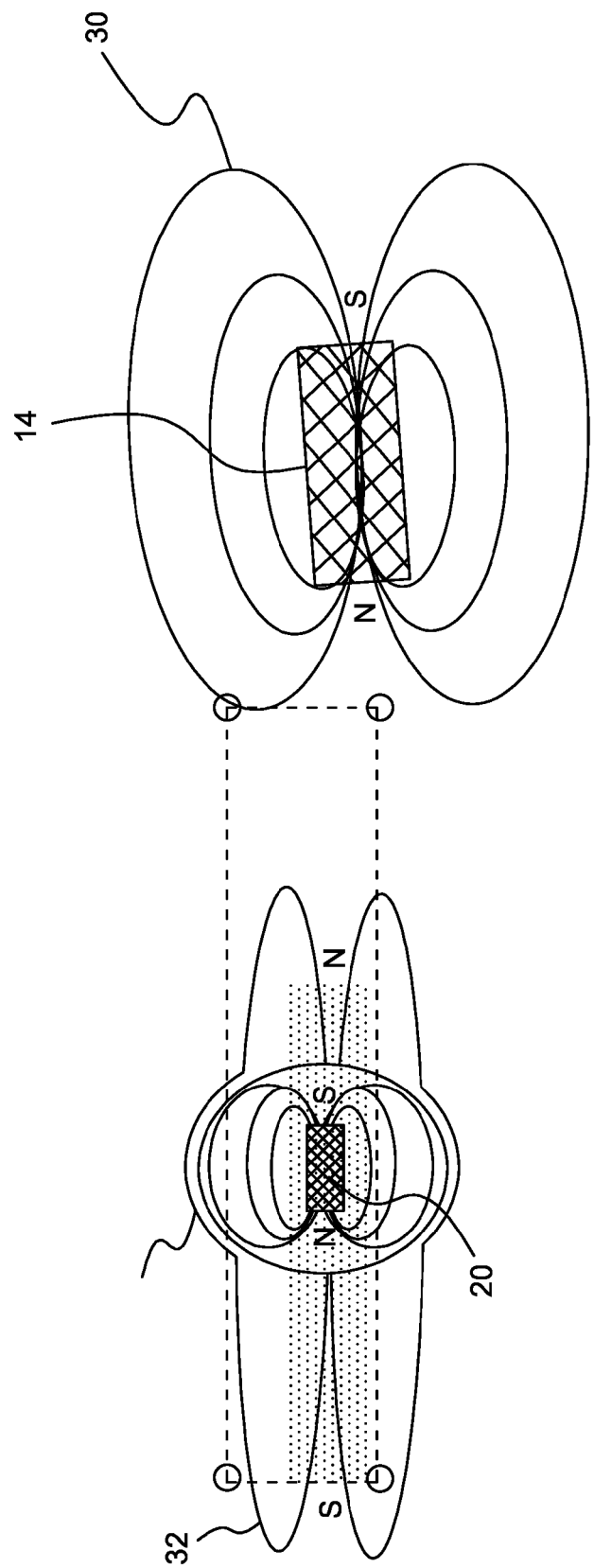
FIG. 3B is side view of the coin having an anomaly, the magnetic element and the magnetic fields of the anomaly and the magnetic element according to the present disclosure.

FIGS. 3A and 3B show a top view and side view, respectively, of the magnetic element magnetic field 30 and the anomaly magnetic field 32. As the magnetic element 14 approaches coin 10 and anomaly 20, the anomaly magnetic field 32 will be disrupted, resulting in a dark spot on film 12 at the location of anomaly 20.

Figure 4A:
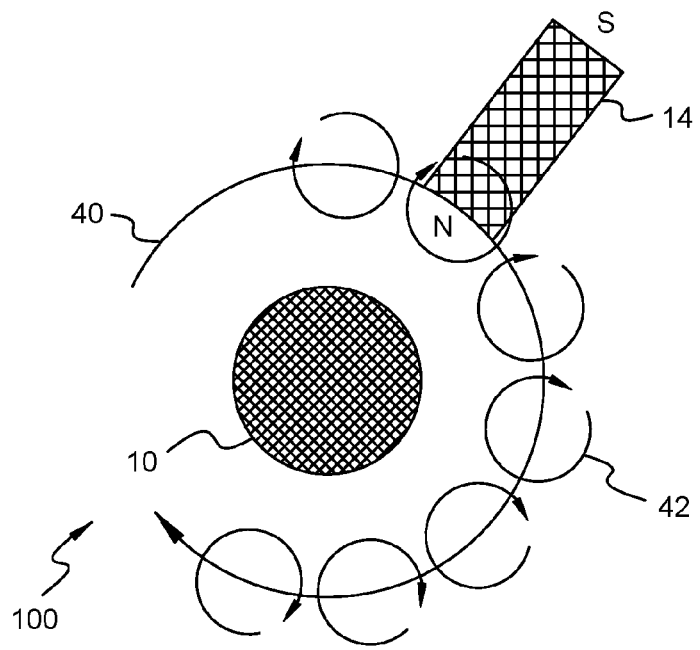
FIG. 4A is a diagram showing a top view of the orbital method of moving the magnetic element with respect to the coin scanner; illustrating the rotation of the magnetic element as it moves toward and away from the center of the coin, along with the orbital revolution of the magnet around the coin scanner.

FIG. 4A shows the orbital method 100 of detecting an anomaly 20 in accordance with the present disclosure. Hold coin scanner 100 in one hand and magnetic element 14 in the other hand. Position magnetic element 14 so one side is pointed away from coin scanner 100. Hold coin scanner 100 horizontal or flat with magnetic field viewing film 12 facing upward toward magnetic element 14. Move magnetic element 14 in slow small circles 42 generally between 4" and 6" in diameter. Circles 42 should be kept horizontal with respect to coin scanner 100. Keeping magnetic element 14 in close proximity to coin scanner 100 optimizes results.

With each pass around coin scanner 100 with magnetic element 14 the image representing the location of anomaly 20 becomes clearer. As magnetic element 14 moves roughly in one direction the nickel particles of magnetic field viewing film 12 may align in one direction. When magnetic element 14 is closest to coin 10 it has the most influence on anomaly magnetic field 32. In contrast, when anomaly magnetic field 32 is subjected to random movement patterns on film 12 the image on film 12 representing anomaly 20 begins to disappear because anomaly magnetic field 32 is not consistently disrupted by magnetic element 14.

Depending on the variables related to an experiment, variations within the method may optimize results. For example, extra passes may provide extra resolution. Using a rare earth magnet (1.5", 0.75", 0.5"). For a ⅜" dia. iron washer covered by ⅛" copper one pass around a test object with magnetic element 14 was required for a successful result. For a ⅛" dia. iron wire covered by 3/16" lead—three passes. For a 3/16" dia. tungsten wafer covered by 3/16" lead—three passes. For a 3/16" dia. tungsten wafer covered by ⅛" gold—three passes. For a 3/16" dia. tungsten wafer covered by ⅛" silver—three passes. For a 1/16" dia. tungsten wire covered by ⅛" gold—five passes.

The range of distance between magnetic element 14 and the test object at which magnetic element 14 is effective for a typical embodiment is generally less than one inch for permanent magnets. When a large difference between the magnetic susceptibilities of the test object and anomaly is present (tungsten 8.44 vs. gold −3.44), the anomaly 20 can be detected up to approximately one inch away from the film. Closer proximity between film 12 and anomaly 20, in addition to a larger difference in magnetic susceptibility, creates greater Magnetic Susceptibility Image (MSI) resolution.

Dependent upon variables that may differ for each test object, the number of rpm's required in the smaller orbit, as opposed to the revolution around the test object, may vary. A difficult object to detect (1/16" diameter tungsten wire) might require moving the magnet in an orbit at 20 to 30 rpm. Stronger magnets, such as rare earth magnets, achieve better results. Square, rectangular or disc magnets are optimal. Donut and thin bar magnets are less effective. A constant magnetic field with parallel flux is also optimal.

In one embodiment of coin scanner 100, the physical measurements are measured as: Outside Diameter—2", Outside Thickness—13/16", Inside Slot Diameter—1½", Inside Slot Height—¼".

Figure 4B:
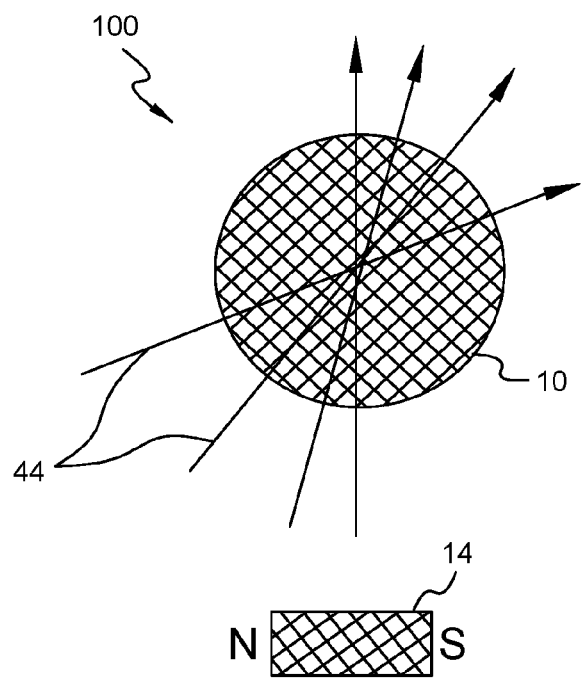
FIG. 4B is a diagram showing a top view of the diametrical method of moving the magnetic element with respect to the coin scanner; illustrating the diametrical movement of the magnetic element as it moves across and through the center of the scanner.

FIG. 4B shows the diametric method of detecting anomaly 20 in accordance with the present disclosure. Moving magnetic element 14 in a straight line across the coin scanner 100, including coin 10, wherein the movement comprises straight lines passing from the edge of the coin scanner 100 through the center of coin scanner 100 to the opposite side of coin scanner 100. The next pass from the user would then begin at a point on the circumference of coin scanner 100 circumferentially adjacent to the initial starting point. This process may be repeated until magnetic element 14 has made a full circumferential pass around coin scanner 100 or until an anomaly 20 is detected as a dark spot on film 12.

In an alternative embodiment of the method of the present disclosure, a coin 10, or test object such as a gold nugget, may be encapsulated, or covered completely, by film 12 in order to allow for 3D scanning. In this embodiment, a test object may be encapsulated, or wrapped, in film 12 and placed in a container, whereupon all sides of the test object could be viewed. By this method, a user could determine whether a gold nugget had been adulterated with, for example, a tungsten anomaly, thereby reducing the value of the nugget. Detecting adulteration with the method of the present disclosure, particularly when more complex methods of detection are not available, is invaluable due to the ease and profitability of adulterating a gold nugget with tungsten.

Figure 5:
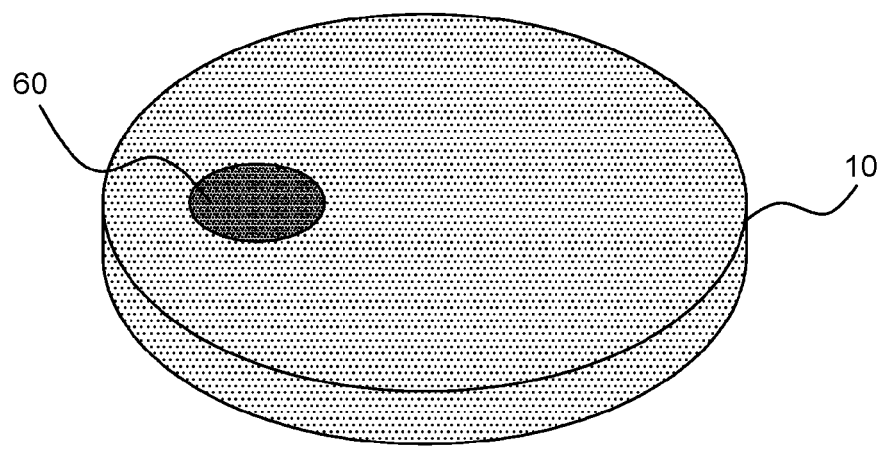
FIG. 5 is perspective view of a coin scanner containing an anomaly wherein the scanner is encased in magnetic field viewing film and after a magnetic element has been applied according to the present disclosure, with the mark on the magnetic field viewing film showing the location of the anomaly.
Figure 6:
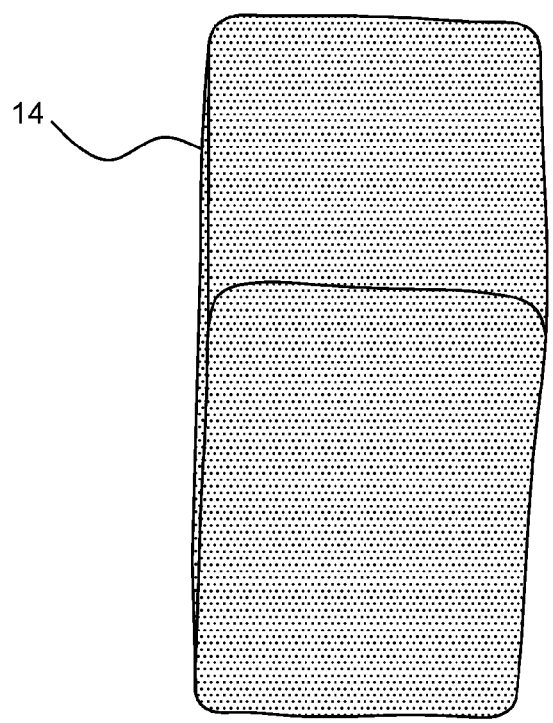
FIG. 6 is perspective view of a magnetic element.

FIG. 5 illustrates a coin encased in film 12 after the 3D scanning method of the present disclosure has been applied. The resulting mark 60 indicates the presence of anomaly 20 at that location. FIG. 6 illustrates the shape of a representative magnetic element 14 of the present disclosure.

While preferred embodiments of this disclosure have been described above and shown in the accompanying drawings, it should be understood that applicant does not intend to be limited to the particular details described above and illustrated in the accompanying drawings, but intends to be limited only to the scope of the disclosure as defined by the following claims. In this regard, the term "configured" as used in the claims is intended to include not only the designs illustrated in the drawings of this application and the equivalent designs discussed in the text, but it is also intended to cover other equivalents now known to those skilled in the art, or those equivalents which may become known to those skilled in the art in the future.

I claim:

1. A method comprising:
   placing a magnetic field viewing film over a coin potentially containing an anomaly;
   and determining a location of the anomaly based on a visualization by the magnetic viewing film of a magnetic field produced by a magnetic element.

2. The method according to claim 1, further comprising:
   adjusting movement of the magnetic element based on the visualization by the magnetic field viewing film of the magnetic field produced by the magnetic element.

3. The method according to claim 1, wherein the magnetic field viewing film comprises a flexible sheet and a plurality of magnetic particles responsive to the magnetic field produced by the magnetic element.

4. The method of claim 1, further comprising:
   enclosing the coin with a transparent, non-magnetic housing having an inner chamber; said inner chamber configured to receive the coin such that when the housing is closed it contains the coin and the magnetic field viewing film, thereby forming a coin scanner.

5. The method of claim 1, wherein the magnetic element is comprised of neodymium.

6. The method of claim 1, wherein a volume of the magnetic element is approximately equivalent to a volume of a 2" cube or larger.

7. A method for training comprising:
   a) placing an anomaly in a hollow coin;
   b) joining the two halves of the hollow coin together;
   c) placing a magnetic field viewing film adjacent the hollow coin;
   d) placing the hollow coin containing the anomaly and the magnetic field viewing film in a housing to form a coin scanner;
   e) holding the coin scanner in a first hand and a magnetic element in a second hand;
   f) positioning the magnetic element so that a first large rectangular surface is facing away from the coin scanner and the first large rectangular surface is generally perpendicular to a plane of the coin scanner;
   g) holding the coin scanner in a generally horizontal plane with a first surface facing vertically upward;
   h) moving the magnetic element in slow small circles approximately between 4" and 6" in diameter wherein the circles are kept horizontal while keeping the magnetic element close to the coin scanner;
   i) rotating the magnetic element multiple times;
   j) rotating the coin scanner approximately 90 degrees in a first direction;
   k) repeating step (i) until all sides of the coin scanner have been scanned;
   l) viewing disturbances in a magnetic field as black or light areas on the magnetic field viewing film.

8. A kit comprising:
   a magnetic field viewing film;
   a metal test object; and
   a magnetic element configured to produce a magnetic field that is visualized by the magnetic field viewing film further comprising additional instructions for use of the kit wherein the test object is a coin, the additional instructions comprising:
   a) placing the coin into a coin scanner;
   b) moving the magnetic element in a straight line across the coin scanner, wherein the movement comprises straight lines passing from the edge of the scanner through the center of the scanner to the opposite side of the scanner;
   c) repeating step (b) beginning at a point on the edge of the coin scanner adjacent the previous starting point until an anomaly is identified;
   d) viewing disturbances in the magnetic field as black or light objects on the magnetic field viewing film.

9. The kit according to claim 8, further comprising instructions for use of the kit, the instructions comprising:
   placing the magnetic field viewing film over the metal test object; and
   determining location of the anomaly based on a visualization by the magnetic field viewing film of the magnetic field produced by the magnetic element and the anomaly.

10. The kit according to claim 8, wherein the anomaly is selected from the group consisting of tungsten, iron, copper, brass, glass, plexiglass, and metal alloys.

11. The kit according to claim 8, wherein the magnetic element is comprised of neodymium.

12. The kit according to claim 8, wherein the magnetic field viewing film comprises a flexible sheet and a plurality of magnetic particles responsive to the magnetic field produced by the magnetic element.

13. The kit according to claim 8, further comprising additional instructions for use of the kit, the additional instructions comprising:
   a) placing a test object, wherein the test object is a coin, into a coin scanner;
   b) placing a shim between the coin and a face of the coin scanner;

c) moving the magnetic element in small circles as close as possible to the coin scanner, wherein the movement comprises circles approximately two to three inches in diameter; and d) viewing disturbances in the magnetic force as black or light objects on the magnetic field viewing film.

14. The kit of claim 8, wherein the magnetic element is rotated in an orbit at 20 to 30 rpm adjacent the coin scanner while revolving around the coin scanner at a constant rate while maintaining a polarity of the magnetic element with respect to the coin.

15. The kit of claim 8, wherein the metal test object is encapsulated and covered on all sides in magnetic field viewing film in order to allow for 3D scanning.

16. The kit of claim 8, wherein the anomaly is embedded within the metal test object and is hidden from view until revealed through display by a magnetic field viewing device.

* * * * *